(12) United States Patent
Jones et al.

(10) Patent No.: US 6,230,753 B1
(45) Date of Patent: May 15, 2001

(54) WAFER CLEANING APPARATUS

(75) Inventors: Oliver David Jones, Watsonville; Jim Vail, Santa Cruz, both of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/113,811

(22) Filed: Jul. 9, 1998

Related U.S. Application Data

(63) Continuation-in-part of application No. 08/683,654, filed on Jul. 15, 1996, now Pat. No. 5,875,507.

(51) Int. Cl.[7] .................................................. B08B 1/04
(52) U.S. Cl. ............................ 139/1.3; 134/6; 15/88.3; 15/102
(58) Field of Search .............................. 15/102, 77, 88.3; 134/1.3, 6

(56) References Cited

U.S. PATENT DOCUMENTS

| | | |
|---|---|---|
| 4,062,463 | 12/1977 | Hillman et al. . |
| 4,202,071 | 5/1980 | Scharpf . |
| 4,208,760 | 6/1980 | Dexter et al. . |
| 4,382,308 | 5/1983 | Curcio . |
| 4,569,695 | 2/1986 | Yamashita et al. . |
| 5,317,778 | 6/1994 | Kudo et al. . |
| 5,351,360 | * 10/1994 | Suzuki et al. ........................ 15/102 |
| 5,357,645 | 10/1994 | Onodera . |
| 5,361,449 | 11/1994 | Akimoto . |
| 5,442,828 | 8/1995 | Lutz . |
| 5,475,889 | 12/1995 | Thrasher et al. . |
| 5,529,638 | 6/1996 | Lutz . |
| 5,555,177 | 9/1996 | Simmons . |
| 5,581,837 | 12/1996 | Uchiyama et al. . |
| 5,606,251 | 2/1997 | Ryle et al. . |
| 5,624,501 | 4/1997 | Gill, Jr. . |
| 5,639,311 | 6/1997 | Holley et al. . |
| 5,651,160 | 7/1997 | Yonemizu et al. . |
| 5,675,856 | 10/1997 | Itzkowitz . |
| 5,693,148 | 12/1997 | Simmons et al. . |
| 5,723,019 | 3/1998 | Krussell et al. . |
| 5,727,332 | 3/1998 | Thrasher et al. . |
| 5,745,946 | 5/1998 | Thrasher et al. . |
| 5,778,554 | 7/1998 | Jones . |
| 5,806,126 | 9/1998 | de Larios et al. . |
| 5,933,902 | 8/1999 | Frey . |

FOREIGN PATENT DOCUMENTS

| | | |
|---|---|---|
| 0 526 245 A1 | 2/1993 | (EP) . |
| 59-086226 | 5/1984 | (JP) . |
| 6-163491 | 6/1994 | (JP) . |
| WO 97/13590 | 4/1997 | (WO) . |

* cited by examiner

*Primary Examiner*—Terrence R. Till
(74) *Attorney, Agent, or Firm*—Martine Penilla & Kim, LLP

(57) ABSTRACT

A method and apparatus for cleaning a wafer oriented vertically is provided. The apparatus includes a first brush and a second brush located horizontally from the first brush. During unloading of the wafer after cleaning, the wafer is located vertically between the first and second brushes and on a pair of rollers. A finger tip located vertically above the region between the first and second brushes contacts an edge of the wafer and thus hold the wafer in the precise unloading position at which a wafer transfer robotic arm has been programmed to engage/disengage the wafer. Accordingly, the wafer is reliably and repeatedly engaged by the robotic arm.

12 Claims, 7 Drawing Sheets

WAFER CLEANING APPARATUS

This application is a continuation-in-part of U.S. application Ser. No. 08/683,654, filed Jul. 15, 1996, now U.S. Pat. No. 5,875,507.

FIELD OF THE INVENTION

The present invention relates generally to semiconductor processing and more particularly to a method and apparatus for cleaning wafers.

BACKGROUND OF THE INVENTION

Semiconductor manufacturing processes demand wafers, typically silicon wafers, which are substantially particulate free. As the semiconductor industry moves towards processing larger diameter wafers, for example 300 millimeter (mm) diameter wafers, it becomes increasingly difficult to remove particulates from the wafers. In particular, wafer cleaning processes must effectively remove particulates from the larger wafer surface area associated with the larger diameter wafers. Further, wafer cleaning processes must clean the wafers without exerting undue force on the wafers since larger diameter wafers have less mechanical strength than smaller diameter wafers.

SUMMARY OF THE INVENTION

In accordance with the present invention, a method and apparatus for cleaning a wafer oriented vertically is provided. In one embodiment, the apparatus includes a first brush and a second brush located horizontally from the first brush. The first brush and the second brush define a region between the brushes. Located vertically below the region defined by the first and second brushes, is a pair of rollers. During loading, a wafer is located vertically in the region between the first and second brushes and on the pair of rollers by a robotic arm.

The apparatus further includes a finger tip located vertically above the region defined by the first and second brushes. After the wafer is placed on the pair of rollers by the robotic arm, the finger tip is moved to contact an edge of the wafer and thus hold the wafer in the load/unload position. The robotic arm is then withdrawn from the apparatus.

The first and second brushes are then moved to contact the first and second wafer surfaces, i.e. are closed. The finger tip is then moved away from the edge of the wafer to release the wafer. The first brush, the second brush and wafer are then rotated while rinsing with a liquid to clean the wafer. After cleaning, the finger tip is again moved to contact the wafer edge and thus hold the wafer. The first and second brushes are then moved back away from the wafer, i.e. are opened. The robotic arm is again inserted into the apparatus to engage the wafer. The finger tip is then moved away from the edge of the wafer to release the wafer and the wafer is removed from the apparatus by the robotic arm.

In an alternative embodiment, instead of moving the finger tip away from the edge of the wafer to release the wafer and allow the wafer to rotate, the finger tip can be a V-grooved roller which is capable of rotating. In accordance with this alternative embodiment, the finger tip can remain in contact with the edge of the wafer while the wafer is rotated and cleaned.

In either embodiment, to reliably hold the wafer during loading/unloading, the pair of rollers and the finger tip have V-grooves and the wafer is securely held in the apexes of these V-grooves. Of importance, the wafer is held by the pair of roller and the finger tip at the precise load/unload position at which the robotic arm has been programmed to engage/disengage the wafer. Accordingly, the wafer is reliably and repeatedly engaged by the robotic arm reducing the average cycle time and manufacturing cost associated with wafer processing. Further, the apparatus is well suited for use with robotic arms having double or single armed end-effectors or edge grippers.

The apparatus may also clean the wafer edge in addition to the first and second surfaces of the wafer. In accordance with this embodiment, the finger tip can be a wafer scrubbing pad. By holding the wafer scrubbing pad against the wafer edge while the wafer is rotated during cleaning, the wafer scrubbing pad scrubs the wafer edge while the first and second brushes scrub the first and second wafer surfaces. In this manner, particulate removal from the wafer may be enhanced.

These and other objects, features and advantages of the present invention will be more readily apparent from the detailed description set forth below taken in conjunction with the accompanying drawings.

DETAILED DESCRIPTION

In accordance with the present invention, a method and apparatus for cleaning a wafer oriented vertically is provided. Several elements shown in the following figures are substantially similar. Therefore, similar reference numbers are used to represent similar elements.

Figure 1:
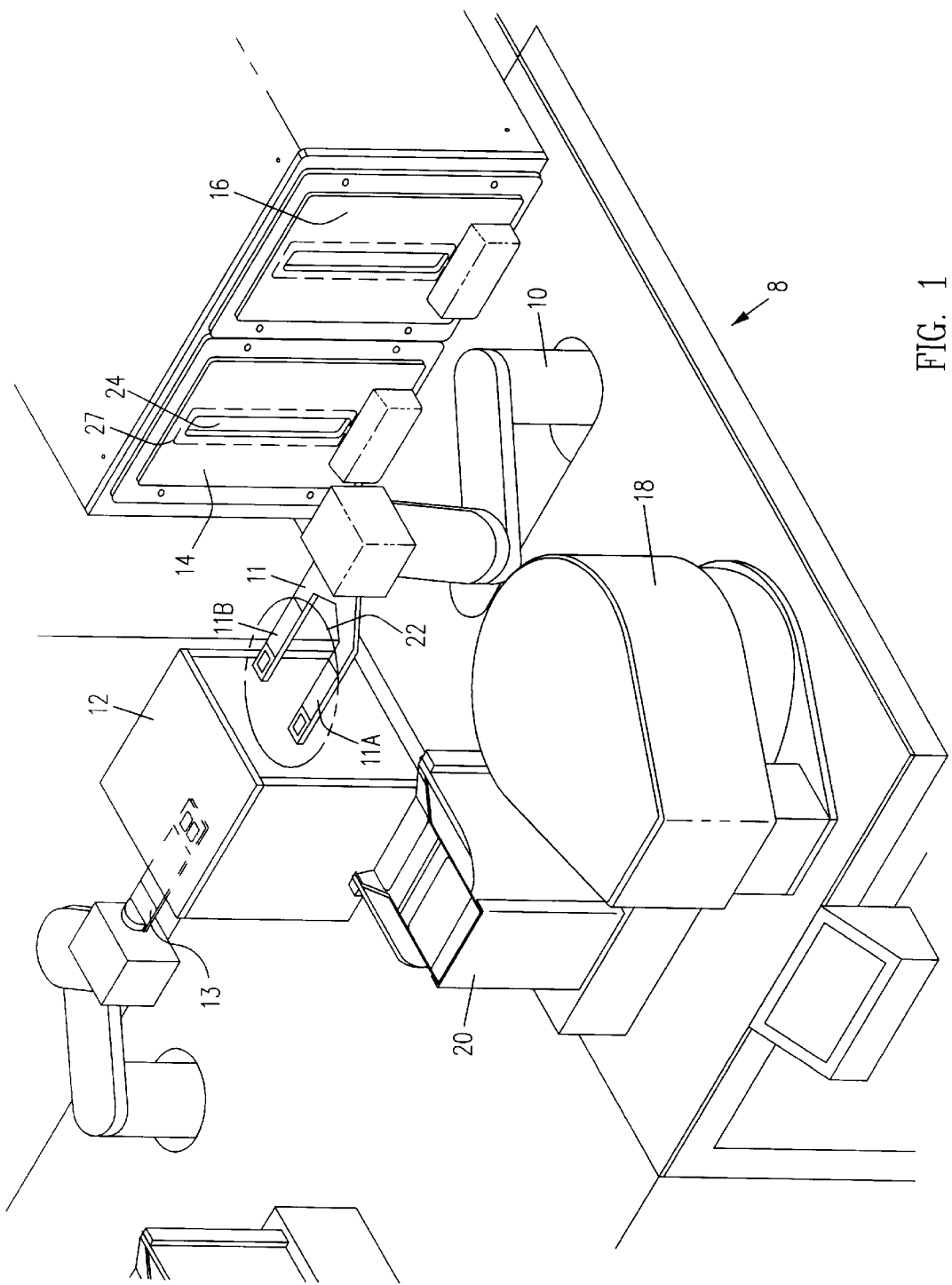
FIG. 1 is a perspective view of wafer cleaning system including a pair of wafer cleaners in accordance with the present invention.

FIG. 1 is a perspective view of wafer cleaning system 8 including wafer cleaners 14, 16 in accordance with the present invention. Wafer cleaning system 8 includes a robotic arm 10, a wet buffer unit 12, wafer cleaners 14, 16, a spin drying unit 18, and a finish cassette 20.

Robotic arm 10 has an end-effector 11 which uses a vacuum to hold a wafer. End-effector 11 can be rotated from the horizontal position in which arm 11A is located horizontally from arm 11B, as shown in FIG. 1, to a vertical position in which arm 11A is located above arm 11B. Wet buffer unit 12 includes a plurality of horizontal slots in which to hold wafers. The wafers may be placed in the horizontal slots by single armed end-effector 13. Typically, wet buffer unit 12 has sprayers which spray liquid on the wafers to keep the wafers wet from previous wafer processing, such as wafer polishing. Wafer cleaners 14 and 16, which are described in detail below, are substantially identical with the exception, in this embodiment, that a different scrubbing solution is used in wafer cleaner 14 than in wafer cleaner 16. Spin drying unit 18 drys the wafer by spinning the wafer at high speeds, thereby removing any liquid from the surface of the wafer. Spin drying unit 18 is further described in Jones, U.S. application Ser. No. 08/680,739, filed Jul. 15, 1996, now U.S. Pat. No. 5,654,468, herein incorporated by reference in its entirety. Finish cassette 20 has a plurality of slots for holding the finished wafers.

During use, robotic arm 10 removes a wafer which is oriented horizontally from wet buffer unit 12 (the perimeter 22 of the wafer as it is removed from wet buffer unit 12 is indicated in FIG. 1). Robotic arm 10 then rotates the wafer 90° to a vertical orientation and inserts the wafer into vertical slot 24 of wafer cleaner 14. After processing of the wafer in wafer cleaner 14 (described below), robotic arm 10 removes the wafer from wafer cleaner 14 through slot 24. This sequence is repeated with wafer cleaner 16. The wafer is then rotated 90° by robotic arm 10. The wafer is then loaded horizontally into spin drying unit 18 and finally is loaded from spin drying unit 18 to finish cassette 20.

Figure 2:
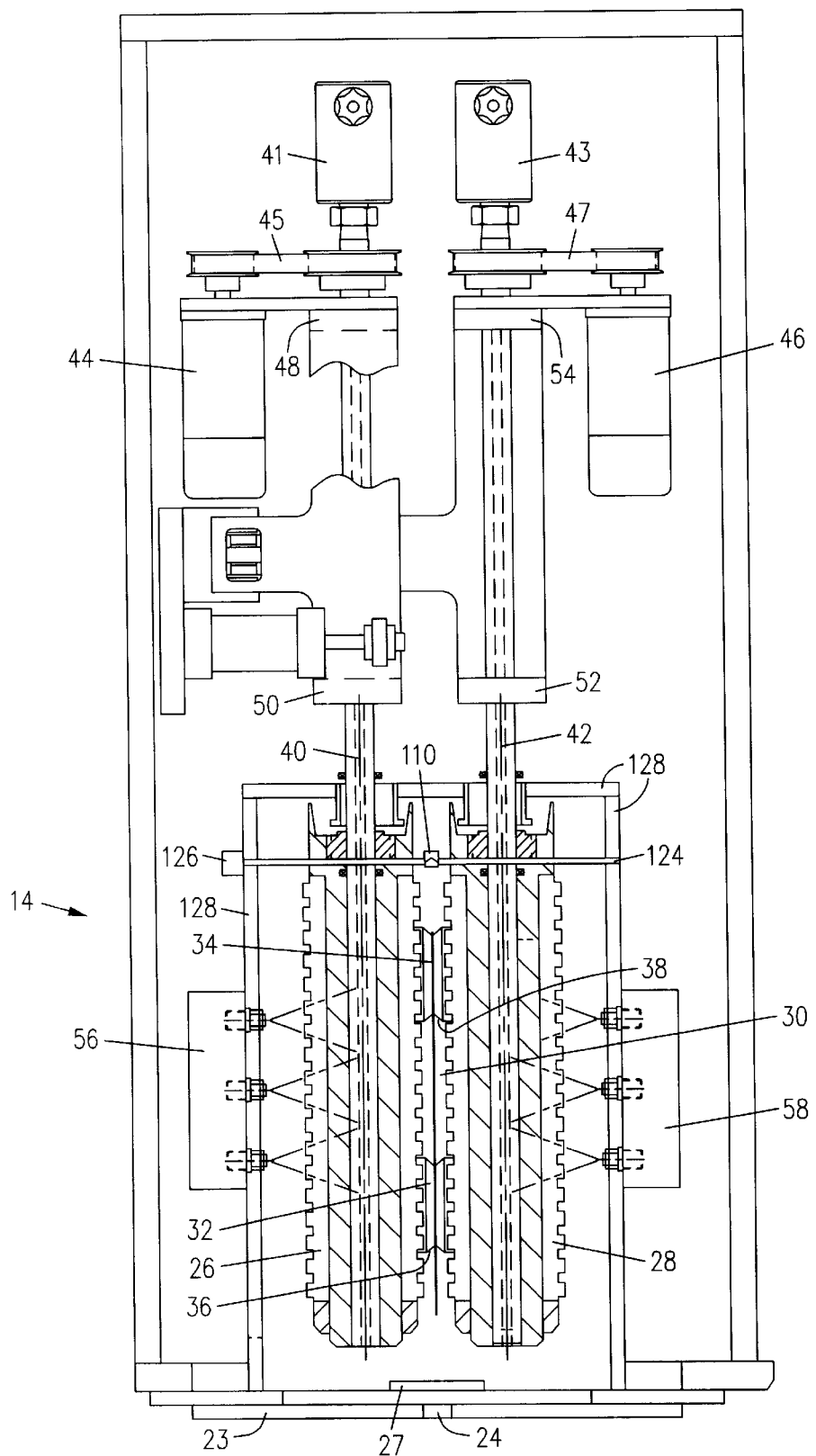
FIG. 2 is a partial top view of one of the wafer cleaners.

FIG. 2 is a partial top view of wafer cleaner 14 in accordance with the present invention. As shown, wafer cleaner 14 includes a housing 23 which includes slot 24 through which a wafer is inserted into wafer cleaner 14. Slot 24 is fitted with a door 27 which opens and closes slot 24. Wafer cleaner 14 further includes a first rotary brush 26 and a second rotary brush 28. Brushes 26, 28 are made of polyvinyl alcohol (PVA) foam although other materials such as nylon, mohair or a mandrel wrapped with polishing pad material can be used. In one embodiment, brushes 26, 28 are PVA foam manufactured by KANEBO of Japan. Brushes 26, 28 are located horizontally from one another.

Located between brushes 26, 28, and defined by brushes 26, 28, is a region 30. Located vertically below region 30 is a first roller 32 and a second roller 34. Rollers 32, 34 have V-grooves 36, 38, respectively, extending around the periphery of the rollers.

Brushes 26, 28 are mounted to first ends of shafts 40, 42, respectively. Rotary unions 41, 43 are mounted to second ends of shafts 40, 42, respectively. Shafts 40, 42 have central cavities formed therein which allow liquid to flow from rotary unions 41, 43 through shafts 40, 42, respectively. Further, shafts 40, 42 have perforations in the regions of shafts 40, 42 to which brushes 26, 28, respectively, are mounted. The perforations allow liquid to be distributed from shafts 40, 42 to brushes 26, 28, respectively, as discussed in more detail in Vail et al., U.S. application Ser. No. 09/112,666, cofiled herewith and incorporated herein by reference in its entirety.

Wafer cleaner 14 further includes a plurality of spray nozzles. In particular, located proximate to and above brush 26 is a first set of spray nozzles 56. Similarly, located proximate to and above brush 28 is a second set of spray nozzles 58. During use, first and second sets of spray nozzles 56, 58, spray liquid towards a wafer located between brushes 26, 28, respectively. In one embodiment, first and second sets of spray nozzles 56, 58, each comprise three individual spray nozzles although other numbers of spray nozzles can be used, e.g. four.

Servo motors 44, 46 are connected to pulleys on the second ends of shafts 40, 42 by drive belts 45, 47, respectively. Shaft 40 is mounted into bearings 48 and 50. Similarly, shaft 42 is mounted into bearings 52 and 54.

Figure 3:
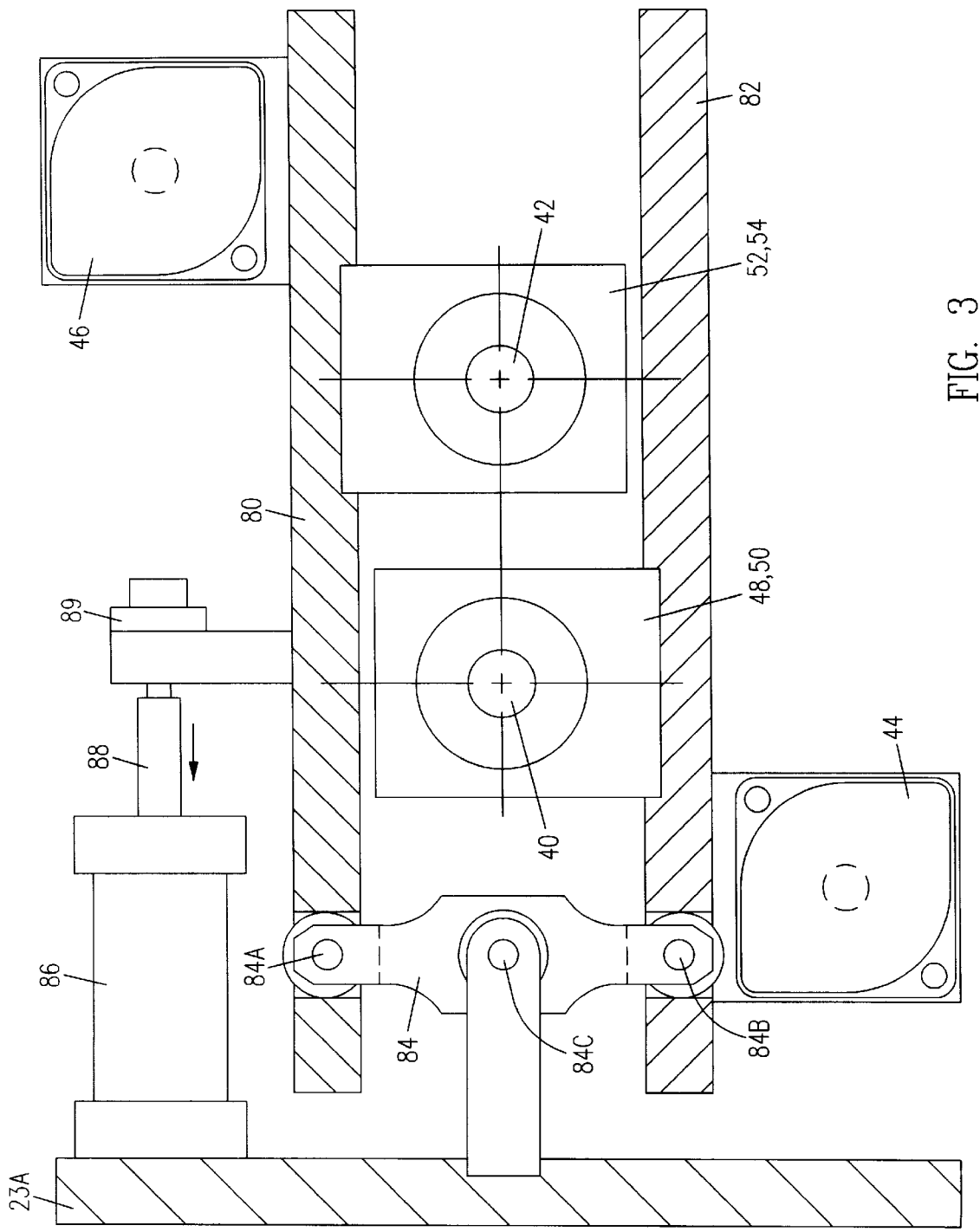
FIG. 3 is a partial frontal view of the wafer cleaner.

FIG. 3 is a partial front view of wafer cleaner 14 in accordance with the present invention. As shown in FIG. 3, bearings 52, 54 are mounted to an upper movable plate 80. Bearings 48, 50 are mounted to a lower movable plate 82. Motors 46, 44 are also mounted to movable plates 80, 82, respectfully. During use, motors 44, 46 rotate shafts 40, 42 in opposite directions, thereby rotating brushes 26, 28 in opposite directions, respectively. Generally, brushes 26, 28 are rotated between 50 to 1500 revolutions per minute.

Further, upper plate 80 is coupled to a first end 84A of a pivot 84 and lower plate 82 is coupled to a second end 84B of pivot 84. Pivot 84 is coupled at its center 84C to a section 23A of housing 23 (or alternatively to a plate 23A connected to housing 23). Also coupled to section 23A is an air cylinder 86. Air cylinder 86 has a piston 88 coupled by a pressure transducer 89 to upper plate 80.

By controlling pressurized air flow into and out of air cylinder 86, the position of piston 88 can be controlled, and hence the position of brushes 26, 28 can be controlled. In particular, when piston 88 is partially extended as in FIG. 3, brushes 26, 28 are located at a distance from one another. However, when piston 88 is retracted into air cylinder 86 (moved in the direction towards section 23A as indicated by the arrow in FIG. 3), upper plate 80 is also moved towards section 23A. Since shaft 42 is mounted to upper plate 80, shaft 42 and brush 28 are also moved towards section 23A.

The movement of upper plate 80 towards section 23A causes first end 84A of pivot 84 to also move towards section 23A. Since pivot 84 is coupled at its center 84C to section 23A, the motion of first end 84A causes an equal and opposite motion of second end 84B of pivot 84. Thus, as upper plate 80 moves towards section 23A, lower plate 82 moves away from section 23A. Since shaft 40 is mounted to lower plate 82, shaft 40 and brush 26 are also moved away from section 23A. The net result is that when piston 88 is retracted, brushes 26, 28 are moved towards one another and when piston 88 is extended (moved away from section 23A), brushes 26, 28 are moved away from one another. Further, the pivot 84 ensures that the perpendicular component of force (further described below) of each brush (26, 28) is equal and opposite to that of the other brush (28, 26).

Figure 4:
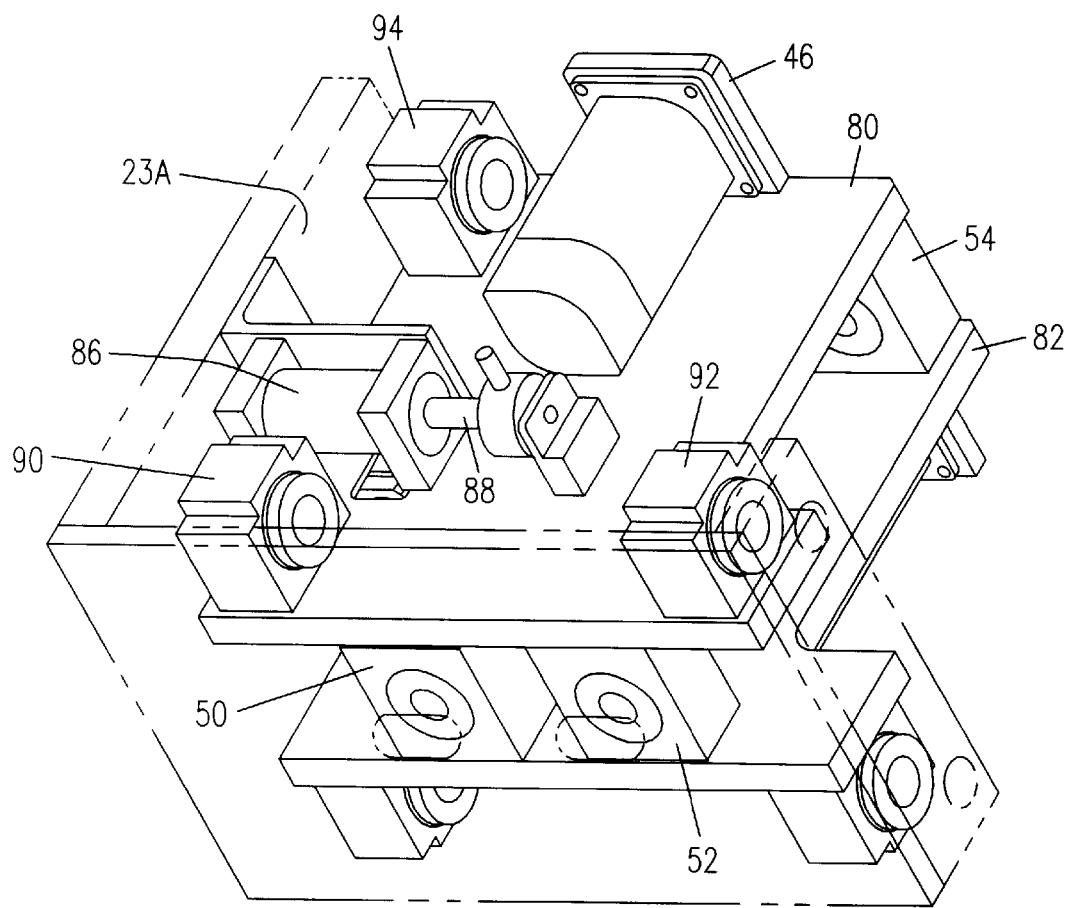
FIG. 4 is a partial perspective view of the wafer cleaner.

FIG. 4 is a partial perspective view of wafer cleaner 14 in accordance with the present invention. As shown in FIG. 4, mounted to upper plate 80 are bearings 90, 92 and 94. Running through bearings 90, 92 is a first immobilized shaft and running through bearing 94 is a second immobilized shaft (these shafts are not illustrated in FIG. 4 for purposes of clarity). As piston 88 of air cylinder 86 is extended and retracted and upper plate 80 moved, upper plate 80 slides along the shafts running through bearings 90, 92, and 94. In this manner, plate 80 is prevented from moving in any direction except perpendicular to the plane of section 23A. Similar bearings and shafts are mounted to plate 82 which also prevent plate 82 from moving in any direction except perpendicular to the plane of section 23A.

Figure 5:
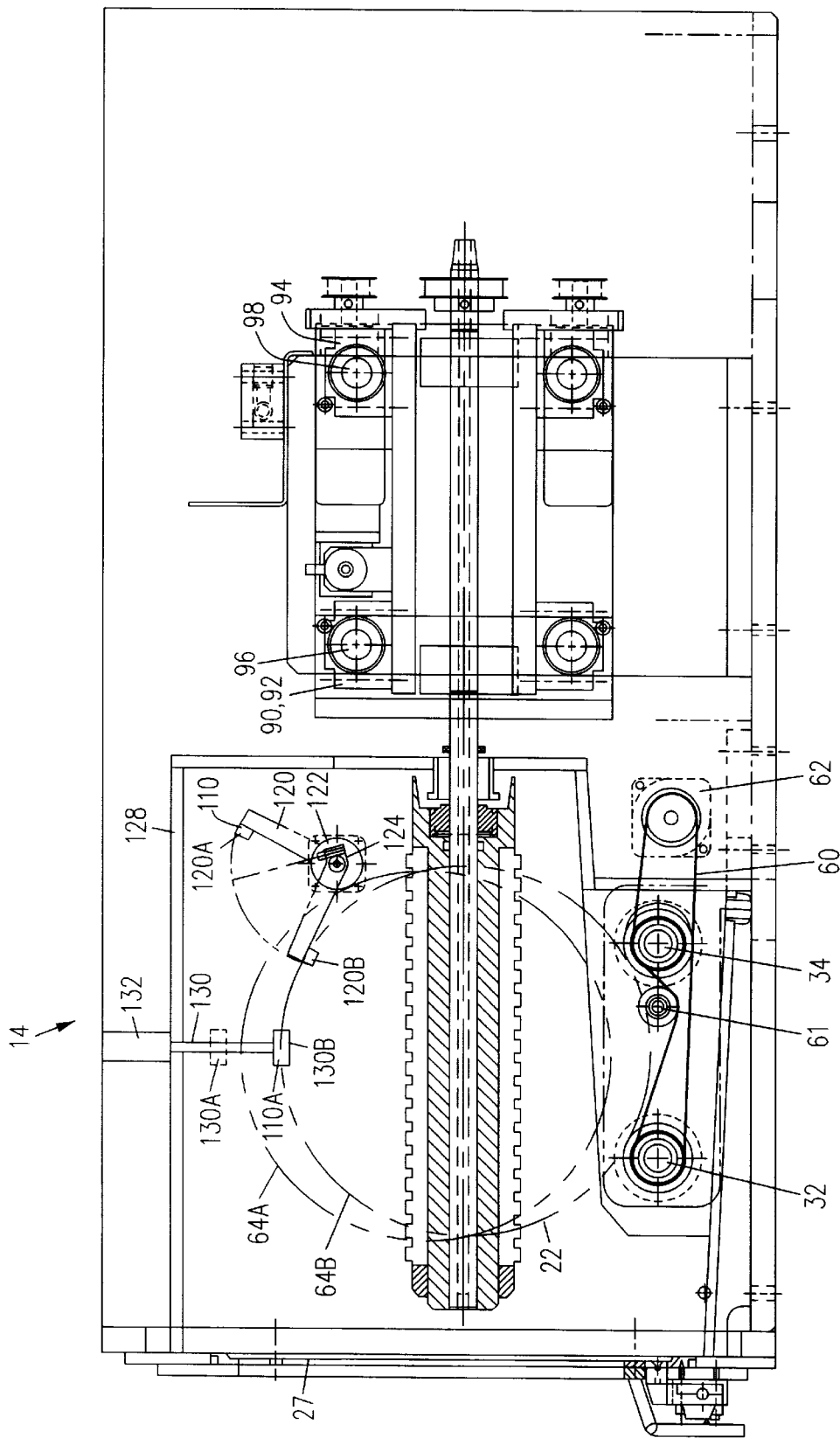
FIG. 5 is a partial side view of the wafer cleaner.

FIG. 5 is a partial side view of wafer cleaner 14 in accordance with the present invention. As shown in FIG. 5, a drive belt 60 couples rollers 32, 34 to roller motor 62. An idler pulley 61 maintains a proper tension in drive belt 60. During use, motor 62 causes drive belt 60 to move thereby rotating rollers 32, 34. Also shown in FIG. 5 are shafts 96 and 98 which run through bearings 90, 92 and 94, respectively.

Figure 6:
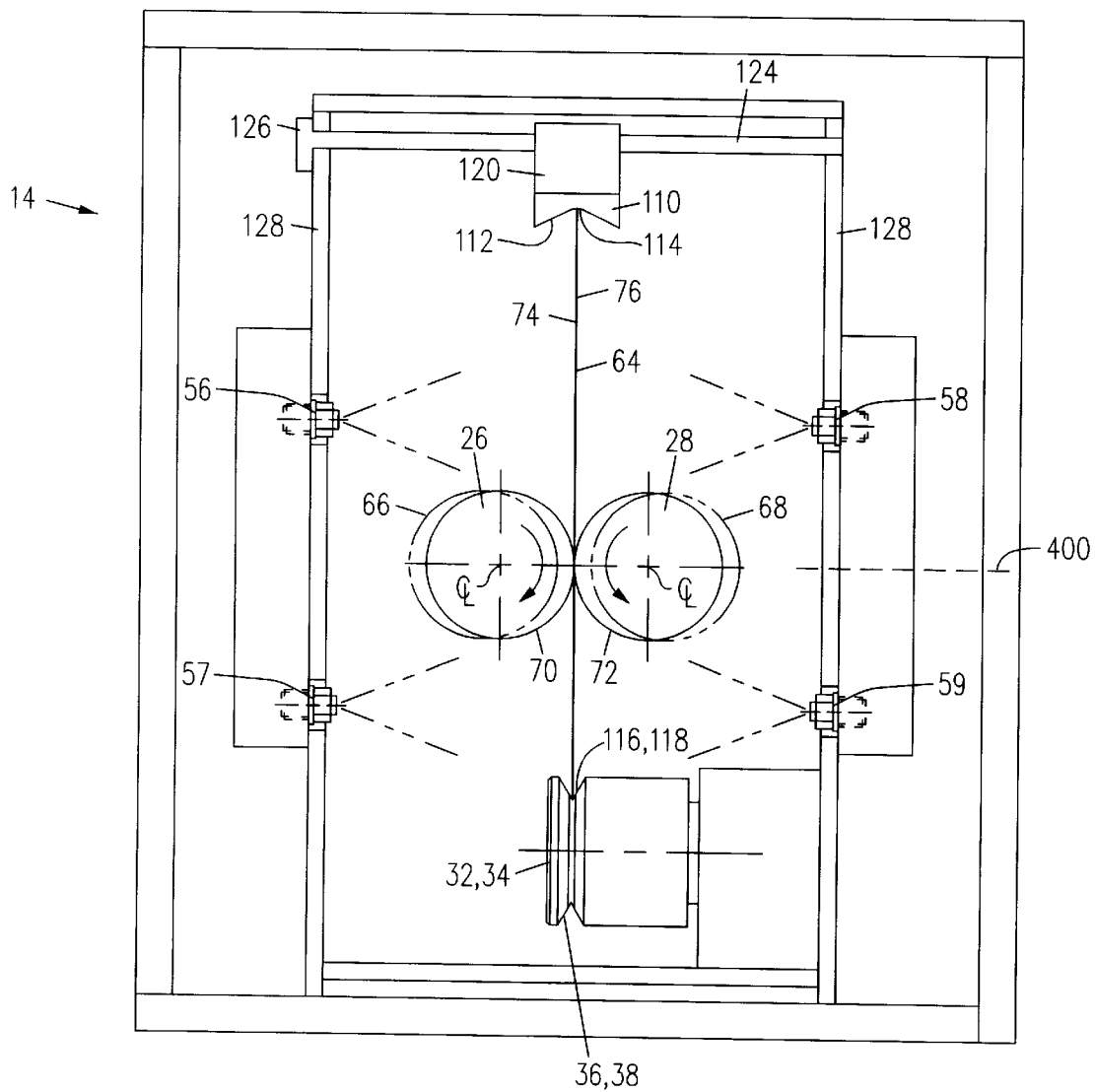
FIG. 6 is a frontal view of the wafer cleaner during use in accordance with the present invention.

FIG. 6 is a partial frontal view of wafer cleaner 14 during use in accordance with the present invention. As shown in FIG. 6, initially brushes 26, 28 are at positions 66, 68, respectively (indicated by phantom circles). Wafer 64 is then inserted vertically through slot 24 into region 30 by robotic arm 10. While the wafer is held by end-effector 11, brushes 26, 28 are moved towards each other to positions 70, 72, respectively. Typically, brushes 26, 28 travel approximately 0.5 inches between positions 66 and 70, 68 and 72, respectively. At positions 70, 72, brushes 26, 28 contact first and second surfaces 74, 76, respectively, of wafer 64. The perpendicular component of force (force exerted perpendicular to planes formed by surfaces 74, 76 of wafer 64) exerted by brush 26 (and brush 28) on to wafer 64 is measured and controlled. For example, by measuring and controlling the force exerted by piston 88 on pressure transducer 89 (FIG. 3), the perpendicular component of force exerted by brushes 26, 28 on to wafer 64 is measured and controlled. Generally, the perpendicular component of force exerted by each brush on wafer 64 is less than 50 pounds per square inch (PSI) and preferably is 5 PSI.

End-effector 11 then releases wafer 64, robotic arm 10 removes end-effector 11 from wafer cleaner 14 and door 27 over slot 24 is closed. As best seen in FIG. 5, wafer 64 is held by brushes 26, 28 at a first position 64A. Brushes 26, 28 are then caused to rotate by servo motors 44, 46 (FIGS. 2, 3), respectively. Servo motors 44, 46 rotate brushes 26, 28 at substantially the same speed. As shown in FIG. 6, brush 26 is rotated clockwise and brush 28 is rotated counterclockwise. This rotation of brushes 26, 28, forces wafer 64 (to a position 64B in FIG. 5) into V-grooves 36, 38 of rollers 32, 34, respectively. This engages wafer 64 to rollers 32, 34. Motor 62 then causes rollers 32, 34 to rotate which, in turn, cause wafer 64 to rotate. Generally, the wafer is rotated at less than 500 RPM.

Brushes 26, 28 are then flushed from the inside out by liquid supplied to brushes 26, 28 from shafts 40, 42. Substantially simultaneously, first and second sets of spray nozzles 56, 58, spray liquid on brush 26, first surface 74 of disk 64 and brush 28, second surface 76 of disk 64, respectively.

In one embodiment, wafer cleaner 14 further includes third and fourth sets of spray nozzles 57, 59 located below first and second sets of spray nozzles 56, 58, respectively. During a first stage of the wafer cleaning cycle, a first liquid is sprayed from sets of spray nozzles 57, 59 (or 56, 58). During a second stage of the wafer cleaning cycle, a second liquid is sprayed from sets of spray nozzles 56, 58 (or 57, 59). For example, the first liquid can be a surfactant and the second liquid can be de-ionized water. Alternatively, the same liquid can be sprayed from sets of spray nozzles 56, 57, 58, 59 simultaneously. Further, additional liquids can be sprayed during various stages of the wafer cleaning cycle by adding additional sets of spray nozzles.

Alternatively, only first and second sets of spray nozzles 56, 58 are used, but individual nozzles of each of the sets of spray nozzles are plumbed to different liquids. In this manner, selective nozzles can spray different liquids at various stages in the wafer cleaning cycle.

The flow of liquid to brushes 26, 28 and first and second sets of spray nozzles 56, 58 is controlled by opening and closing valves coupled to feed lines (not shown) which are plumbed to shafts 40, 42 via rotary unions 41, 43, respectively and sets of spray nozzles 56, 58. Further, the operation of wafer cleaner 14 is controlled by a conventional programmable logic controller (PLC), for example by a PLC model #2600 manufactured by Control Technology Corp. located in Hopkinton, Mass.

The combination of the scrubbing action on the surfaces 74, 76 of wafer 64 caused by the rotation of brushes 26, 28 along with liquid supplied through brushes 26, 28 and by sets of spray nozzles 56, 58, removes particulates from surfaces 74, 76 of wafer 64. In particular, particulates are scrubbed from surfaces 74, 76 by brushes 26, 28, respectively. These particulates are flushed from brushes 26, 28 by the liquid supplied to brushes 26, 28 through shafts 40, 42.

Further, particulates which are loosened by the scrubbing action of brushes 26, 28, but remain on surfaces 74, 76 of wafer 64, are flushed from surfaces 74, 76 by liquid sprayed from sets of spray nozzles 56, 58. By orienting wafer 64 vertically instead of horizontally, the removal of particulates from the surfaces 74, 76 is enhanced. In particular, by orienting wafer 64 vertically, liquid sprayed on to surfaces 74, 76 of wafer 64 and particulates trapped in the liquid have a tendency to fall from surfaces 74, 76 due to gravity. In contrast, if wafer 64 were oriented horizontally, particulates would tend to be moved around on surfaces 74, 76 and would not be as readily removed. Thus, wafer cleaner 14 is particularly well suited for larger diameter wafers in which particulates must be removed from a larger surface area. For example, wafer cleaner 14 is particularly well suited for cleaning 200 mm and 300 mm diameter wafers.

Further, by orienting wafer 64 vertically and by scrubbing both surfaces 74, 76 simultaneously, mechanical stress on wafer 64 is minimized. This is because the perpendicular component of the force exerted by brush 26 on wafer 64 is offset by the perpendicular component of the force exerted by brush 28 on wafer 64. (The perpendicular components of force exerted by each brush of the wafer is equal and opposite to that of the other brush.) Thus, the net force which is exerted on wafer 64 by brushes 26, 28 is substantially parallel to the plane formed by surface 74 (or surface 76). Since wafer 64 has the greatest mechanical strength in this plane, wafer cleaner 14 is well suited for larger diameter disks. (Larger diameter disks generally flex when force is exerted in a plane perpendicular to side 74.)

After wafer 64 has been scrubbed for a predetermined period of time, generally 30 to 120 seconds and typically 45 seconds, the flow of liquid to brushes 26, 28 and sets of spray nozzles 56, 58, is shut off. Substantially simultaneously, the rotation of rollers 32, 34 and brushes 26, 28 is stopped. Door 27 over slot 24 is opened, robotic arm 10 inserts end-effector 11 into slot 24 and the end-effector 11 engages wafer 64. Then, Brushes 26, 28 are moved back to positions 66, 68, respectively, and robotic arm 10 removes wafer 64. Wafer cleaner 14 is now ready to process another wafer.

Figure 7:
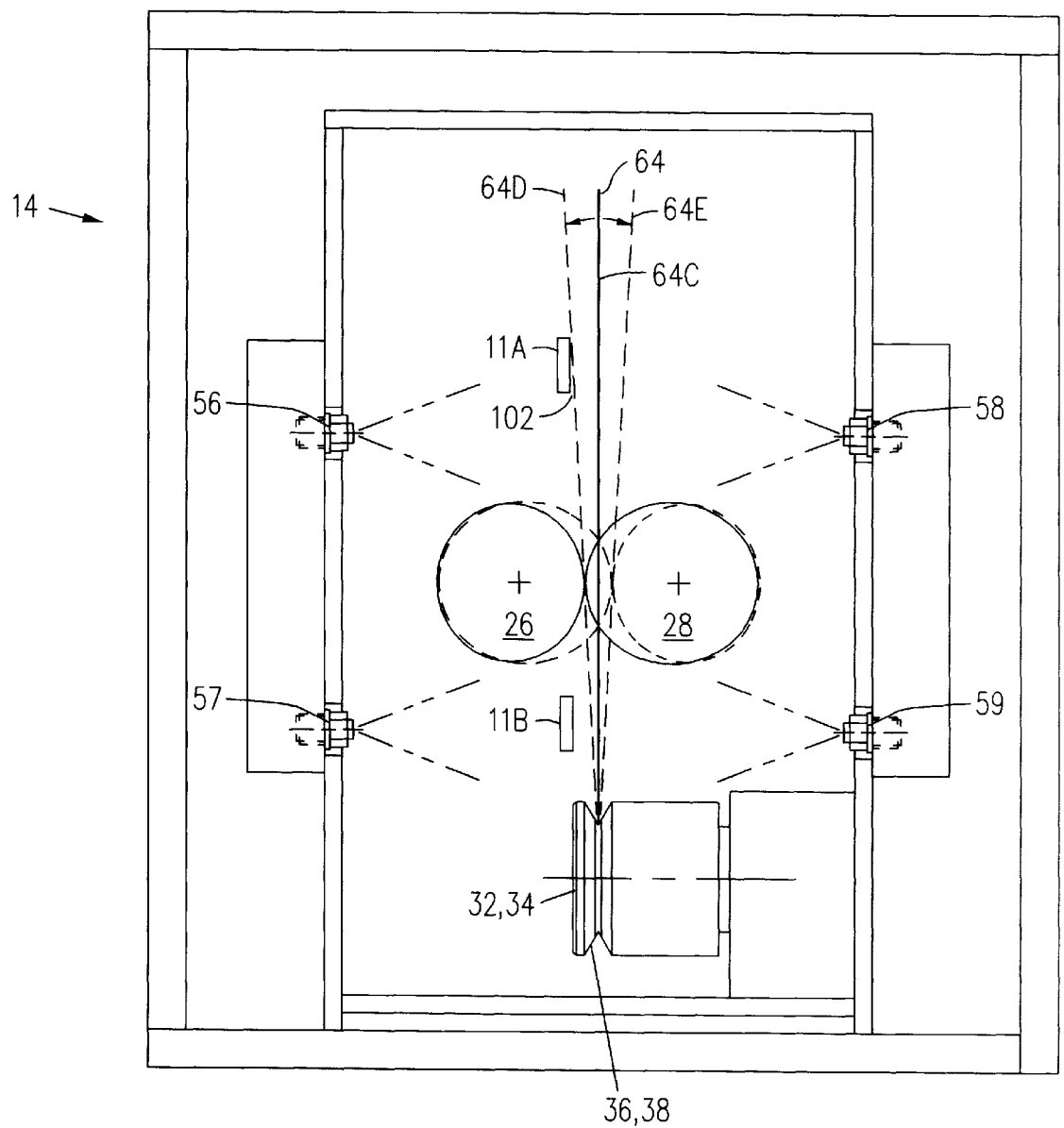
FIG. 7 is a frontal view of the wafer cleaner illustrating vertical displacement of the wafer due to eccentricity of the rotary brushes.

One difficulty with larger diameter wafers is vertical displacement due to eccentricity (unevenness) of brushes 26, 28. FIG. 7 is a frontal view of wafer cleaner 14 illustrating vertical displacement of wafer 64 due to eccentricity of brushes 26, 28. As shown in FIG. 7, wafer 64 can be vertically displaced from center position 64C either to the left as illustrated by position 64D or to the right as illustrated by position 64E. Of importance, as the art moves to larger diameter wafers such as 300 mm diameter wafers, vertical displacement of the wafer increases for any given amount of eccentricity of brushes 26, 28.

The vertical displacement of wafer 64 reduces the reliability of end-effector 11 in engaging wafer 64. As shown in FIG. 7, when wafer 64 is in position 64D as an example, arm 11A of end-effector 11 contacts wafer 64 before arm 11B. In this situation, when vacuum is applied to end-effector 11 to suction and hold wafer 64, lack of intimate contact between arm 11B and wafer 64 prevent formation of a vacuum seal between arm 11B and wafer 64. This vacuum leak is detected using conventional end-effector technology (e.g. by detecting a failure of the vacuum line connected to end-effector 11 to reach a suitable subatmospheric pressure). As a result, engagement of wafer 64 with end-effector 11 is aborted and end-effector 11 is moved away from wafer 64.

The sequence is then reinitiated to once again attempt to engage wafer 64 with end-effector 11.

In accordance with the present invention, robotic arm 10 can have a single arm end-effector to move wafer 64. To illustrate, instead of having an end-effector 11 with arms 11A and 11B, an end-effector with only a single arm, e.g. only arm 11A, can be used. However, as shown in FIG. 7, even if an end-effector with only a single arm 11A is used, vacuum can leak from a separation 102 caused by misalignment between arm 11A and wafer 64 causing the wafer engagement cycle to be aborted. Accordingly, displacement of wafer 64 increases average wafer cycle time thus reducing throughput and increasing the wafer processing cost.

To prevent displacement of wafer 64, referring back to FIG. 6, a finger tip 110 can be used to align wafer 64. Typically, finger tip 110 is formed of a relatively chemically inert low particulate generating material such as polyvinylidene fluoride (PVDF). Finger tip 110 is typically shaped as a block with a V-groove 112 cut into one side although other shapes having a V-groove 112 can be used. In one embodiment, finger tip 110 is a roller having a V-groove 112.

When finger tip 110 is in the hold position as illustrated in FIG. 6, wafer 64 is held between the apexes 114 and 116, 118 of V-grooves 112 and 36, 38, respectively, thus ensuring each wafer 64 is in the same position after being scrubbed by brushes 26, 28, i.e. when brushes 26, 28 and wafer 64 finish rotating.

Referring again to FIG. 5, finger tip 110 is attached to an end of finger 120 or, alternatively, is integral with the end of finger 120. A base section 122 of finger 120, opposite finger tip 110, is attached to a shaft 124. Finger tip 110 is moved between a release position 120A and a hold position 120B by rotation of shaft 124.

As shown in FIGS. 2 and 6, the rotation of shaft 124 is controlled by a rotary actuator 126, e.g. a pneumatic rotary actuator. Actuator 126 is mounted to the outside of an inner housing 128 which defines the cavity in which wafer 64 is cleaned. Shaft 124 is located and rotatably held at both ends by inner housing 128 (or by one or more bearings attached to inner housing 128). Shaft 124 is perpendicular to the longitudinal axis of brushes 26, 28 and parallel to the plane 400 defined by the centerline of brushes 26, 28. Finger tip 110 is located vertically above region 30 between brushes 26, 28. To determine the exact location of finger 120 and thus finger tip 110, one or more sensors can be employed to sense the position of shaft 124. The force exerted by finger tip 110 on wafer 64 at hold position 120B is controlled by controlling the air pressure provided to actuator 126. Generally, the force exerted by finger tip 110 on wafer 64 is less than the amount of force which would cause the wafer to flex, illustratively is one pound or less.

In accordance with this embodiment of the present invention, wafer 64 is loaded into wafer cleaner 14, cleaned, and unloaded as follows. Referring to FIGS. 5 and 6, initially brushes 26, 28 are at positions 66, 68, respectively, i.e. are open, and finger tip 110 is in release position 120A. Wafer 64 is then inserted vertically through slot 24 into region 30 by robotic arm 10 (not shown) to first position 64A. Robotic arm 10 then lowers wafer 64 into V-grooves 36, 38 of rollers 32, 34, respectively, i.e. into position 64B.

Actuator 126 is then activated to rotate finger tip 110 from release position 120A to hold position 120B. Accordingly, V-groove 112 of finger tip 110 presses on edge 22 of wafer 64. As used herein, wafer edge 22 is the wafer outer circumferential edge which extends between wafer surfaces 74, 76. Robotic arm 10 then releases wafer 64 and moves out of wafer cleaner 14. Door 27 closes and brushes 26, 28 move towards each other to positions 70, 72, respectively, i.e. are closed. Actuator 126 is activated again to move finger tip 110 from hold position 120B back to release position 120A. Brushes 26, 28 and wafer 64 are then rotated and liquid supplied through shafts 40, 42 and spray nozzles 56, 58 and/or 57, 59 as described above to clean wafer 64.

After cleaning, actuator 126 is activated again to move finger tip 110 from release position 120A to hold position 120B. Accordingly, the edge of wafer 64 contacts V-groove 112 typically at an offset distance from apex 114 due to vertical displacement of wafer 64 as described in reference to FIG. 7. Brushes 26, 28 are then moved back to positions 66, 68, respectively, i.e. are opened. As brushes 26, 28 are opened, wafer 64 slides along V-groove 112 to apex 114. Wafer 64 slides along V-groove 112 since actuator 126 is force regulated and presses finger tip 110 against wafer 64. It is understood that finger tip 110 moves downwards slightly as wafer 64 slides along V-groove 112 to apex 114. Accordingly, finger tip 110 may move slightly at hold position 120B when brushes 26, 28 are opened.

As a result of being seated in apex 114, wafer 64 is held at the precise location at which robotic arm 10 has been programmed to engage wafer 64, i.e. between apexes 114, 116, 118 of V-grooves 112, 36, 38, respectively.

Door 27 is then opened and robotic arm 10 inserts end-effector 11 which engages wafer 64. Actuator 126 is again activated to rotate finger tip 110 from hold position 120B to release position 120A. Robotic arm 10 then moves wafer 64 up from position 64B to position 64A and then out of wafer cleaner 14. Wafer cleaner 14 is now ready to process another wafer.

It is understood that in other alternative embodiments, other mechanisms can be used to control the position of finger tip 110A. For example, instead of moving finger tip 110A in the plane defined by wafer 64 as described above, finger tip 110A can be pivoted or otherwise moved in a plane perpendicular or at an angle to the plane defined by wafer 64, i.e. from either side 74, 76 of wafer 64.

In one alternative embodiment, a finger tip 110A (substantially identical to finger tip 110 as discussed above) can be attached to the end of a piston 130 of an air actuated cylinder 132 as illustrated in FIG. 5. Air actuated cylinder 132 is located outside of and mounted to inner housing 128 and piston 130 extends through inner housing 128. Finger tip 110A is located vertically above region 30 between brushes 26, 28.

In accordance with this embodiment, air cylinder 132 is controlled to extend and retract piston 130 to move finger tip 110A from a release position 130A to a hold position 130B to release and hold wafer 64 during loading and unloading. The force exerted by finger tip 110A on wafer 64 is controlled by controlling the air pressure provided to air cylinder 132. Otherwise, processing is substantially similar to that described in reference to finger 120 and finger tip 110.

In either embodiment, finger tip 110 (110A) can be a V-grooved roller which is capable of rotating similar to rollers 32, 34. In accordance with this alternative embodiment, finger tip 110 (110A) can remain in hold position 120B (130B) while wafer 64 is rotated during cleaning. In contrast, when finger tip 110 (110A) is shaped as a block having a V-groove, finger tip 110 (110A) should be retracted to release position 120A (130A) to allow wafer 64 to rotate during cleaning. In all other aspects, processing is substantially similar to the processing described above.

Advantageously, finger tip 110 (110A) holds wafer 64 at the precise load/unload position at which robotic arm 10 has been programmed to engage wafer 64, i.e. between apexes 114, 116, 118 of V-grooves 112, 36, 38, respectively. Accordingly, wafer 64 is reliably and repeatable engaged by end-effector 11 reducing the average cycle time and manufacturing cost associated with wafer processing. Further, use of finger tip 110 (110A) is well suited for use with double armed end-effectors such as end-effector 11 illustrated in FIG. 1. Alternatively, a single armed end-effector can be used.

As a further alternative, finger tip 110 (110A) enables use of a wafer edge gripper instead of a conventional end-effector. In particular, a wafer edge gripper engages wafer 64 by edge 22 and does not contact wafer surfaces 74, 76 thus reducing or eliminating the possibility of contaminating wafer surfaces 74, 76. To enable the edge gripper to engage wafer edge 22, brushes 26, 28 are moved to positions 66, 68, i.e. are opened. Of importance, wafer 64 is held in place by finger tip 110 (110A) allowing use of a wafer edge gripper instead of a conventional end-effector.

Figure 5A:
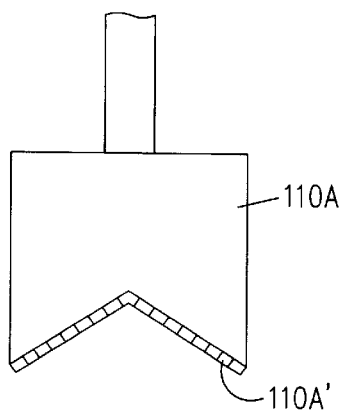
FIG. 5A is a side view of a wafer edge scrubbing pad in accordance with one embodiment of the present invention.

In some manufacturing processes, it may be desirable to clean wafer surfaces 74, 76 and also wafer edge 22. To accomplish this, instead of being a V-grooved wafer holder as illustrated in FIG. 6, finger tip 110 (or 110A) can be a wafer edge scrubbing pad, e.g. can be a pad 110A' made of polyvinyl alcohol (PVA) foam, nylon, mohair or polishing pad material as shown in FIG. 5A. In accordance with this embodiment, finger tip 110 (110A) is held in hold position 120B (130B) while wafer 64 is rotated during cleaning. Thus, wafer edge scrubbing pad 110A' scrubs the wafer edge while brushes 26, 28 scrub wafer surfaces 74, 76, respectively, thus enhancing particulate removal from wafer 64.

In one embodiment, wafer cleaner 14 has both a V-grooved wafer holder and a wafer edge scrubbing pad. For example, referring to FIG. 5, finger tip 110 can be a V-grooved wafer holder and finger tip 110A can be a wafer edge scrubbing pad or visa versa. In another alternative, two or more V-grooved wafer holders can be used to hold the wafer, e.g. finger tips 110 and 110A can both be used to hold the wafer.

Referring to FIG. 1, by using two wafer cleaners 14, 16, sequentially, a wafer can be scrubbed and rinsed with two different solutions. In one embodiment, for example, the scrubbing liquid in wafer cleaner 14 is an ammonia solution or a surfactant available from Valtec or Allied. The scrubbing liquid in wafer cleaner 16 is de-ionized water. This arrangement is particularly advantages since residue on the wafer from wafer cleaner 14 is readily removed by the water rinse in wafer cleaner 16. However in alternative embodiments, other scrubbing liquids are used, for example acid or caustic solutions are used in either wafer cleaner 14 or 16. Further, it is understood that only a single wafer cleaner can be used, or that several wafer cleaners can be used.

Although the present invention has been described with reference to various embodiments, persons skilled in the art will recognize that changes may be made in form and detail without departing from the spirit and scope of the invention. For example, the wafer can be a generally circular silicon wafer, glass wafer, ceramic wafer, oxide wafer, tungsten wafer although other types of wafers can be used. Further, although various values for operating parameters such as the cycle time, rotational speed of the brushes, rotational speed of the wafer and the perpendicular component of force exerted by the brushes on the wafer have been provided, it is understand that these values are only illustrative and that other values can be used depending upon the particular application. Further, although finger tips having V-grooves therein are set forth, it is understood that finger tips having other features such as slot or notches can be used. Thus, the invention is limited only by the following claims.

We claim:

1. A substrate cleaning apparatus, comprising:
   a first brush;
   a second brush located horizontally from said first brush;
   a first roller and a second roller located vertically below said first brush and said second brush; and
   a substrate edge scrubbing pad located vertically above said first brush and said second brush.

2. The substrate cleaning apparatus of claim 1 further comprising a piston, said substrate edge scrubbing pad being attached to an end of said piston.

3. The substrate cleaning apparatus of claim 2 further comprising an air cylinder comprising said piston, wherein said substrate edge scrubbing pad is moved between a hold position and a release position by movement of said piston by said air cylinder.

4. The substrate cleaning apparatus of claim 1 wherein said substrate edge scrubbing pad is selected from the group consisting of polyvinyl alcohol foam, nylon, mohair and polishing pad material.

5. The substrate cleaning apparatus of claim 1 further comprising a finger tip for holding said substrate during loading and unloading.

6. A substrate cleaning system comprising the apparatus of claim 1, said system further comprising a robotic arm.

7. The substrate cleaning system of claim 6 further comprising an end-effector attached to said robotic arm.

8. The substrate cleaning system of claim 7 wherein said end-effector is a two armed end-effector.

9. The substrate cleaning system of claim 7 wherein said end-effector is a single armed end-effector.

10. A method of cleaning a substrate comprising the steps of:
    inserting said substrate vertically into a region located between a first brush and a second brush;
    scrubbing a first surface of said substrate with said first brush, a second surface of said substrate with a second brush and an edge of said substrate with a scrubbing pad.

11. The method of claim 10 further comprising the step of moving said scrubbing pad to contact said edge of said substrate after said step of inserting.

12. The method of claim 11 wherein said step of scrubbing comprises rotating said first brush, said second brush and said substrate.

* * * * *